United States Patent
Ozono

(10) Patent No.: US 9,444,447 B2
(45) Date of Patent: Sep. 13, 2016

(54) LOAD DRIVE CIRCUIT

(71) Applicant: SANKEN ELECTRIC CO., LTD., Niiza-Shi, Saitama (JP)

(72) Inventor: Yuta Ozono, Niiza (JP)

(73) Assignee: SANKEN ELECTRIC CO., LTD., Niiza-shi (JP)

( * ) Notice: Subject to any disclaimer, the term of this patent is extended or adjusted under 35 U.S.C. 154(b) by 0 days.

(21) Appl. No.: 14/972,803

(22) Filed: Dec. 17, 2015

(65) Prior Publication Data

US 2016/0191045 A1 Jun. 30, 2016

(30) Foreign Application Priority Data

Dec. 25, 2014 (JP) ................................ 2014-261586

(51) Int. Cl.
| | |
|---|---|
| H03B 1/00 | (2006.01) |
| H03K 3/00 | (2006.01) |
| H03K 17/56 | (2006.01) |
| H01F 7/06 | (2006.01) |

(52) U.S. Cl.
CPC .............. H03K 17/56 (2013.01); H01F 7/064 (2013.01)

(58) Field of Classification Search
CPC ............ H02M 3/33523; H02M 3/158; H03K 17/567; H03K 17/6871; H03K 17/687
USPC ....... 327/108–112, 427, 434, 437, 390, 589; 326/80, 82, 83, 87; 363/19, 49, 21.01; 323/288, 271, 311
See application file for complete search history.

(56) References Cited

U.S. PATENT DOCUMENTS

| | | | | |
|---|---|---|---|---|
| 7,663,354 | B2* | 2/2010 | Kudo | H03K 5/08 323/225 |
| 2003/0002352 | A1* | 1/2003 | Kim | G11C 8/08 365/189.11 |
| 2007/0159150 | A1* | 7/2007 | Hosokawa | H02M 3/1588 323/285 |
| 2008/0018364 | A1* | 1/2008 | Clarkin | H02M 1/08 327/110 |
| 2010/0027176 | A1 | 2/2010 | Kawate et al. | |
| 2011/0304309 | A1* | 12/2011 | Nakamura | H02M 3/156 323/288 |
| 2012/0187934 | A1 | 7/2012 | Suzuki | |
| 2014/0177284 | A1* | 6/2014 | Nakano | H02M 1/36 363/19 |
| 2014/0217959 | A1 | 8/2014 | Chen et al. | |

FOREIGN PATENT DOCUMENTS

JP 2013-16959 A 1/2013

* cited by examiner

Primary Examiner — Lincoln Donovan
Assistant Examiner — Thomas Skibinski
(74) Attorney, Agent, or Firm — Mots Law, PLLC

(57) ABSTRACT

A switch electrically connected to a first terminal and a second terminal. A first comparator detects a load open state where the switch is off and a load is not connected to the second terminal. Upon detecting, a clamp circuit clamps the voltage of the second terminal to a clamp voltage higher than a first reference voltage and lower than an input voltage. A second comparator detects an output-to-supply short circuit state where the switch is off and the second terminal is connected to the power supply. A capacitor with one terminal connected to the second terminal and another terminal connected to a third terminal. A bootstrap circuit supplies a charge current to the third terminal at a constant voltage. A clamp voltage rise prevention circuit prevents the clamp voltage of the clamp circuit from rising, when the first comparator detects the load open state.

5 Claims, 6 Drawing Sheets

LOAD DRIVE CIRCUIT

CROSS REFERENCE TO RELATED APPLICATIONS

This application claims priority based on 35 USC 119 from prior Japanese Patent Application No. 2014-261586 filed on Dec. 25, 2014, entitled "LOAD DRIVE CIRCUIT", the entire contents of which are hereby incorporated by reference.

BACKGROUND

This disclosure relates to a load drive circuit that drives a load such as a solenoid by using a switching element.

A background technique of the load drive circuit is disclosed in Japanese Patent Application Publication No. 2013-16959 (Patent Document 1). This load drive circuit detects a load open state, where a load is not connected to an output terminal because of disconnection between the output terminal and the load or any other reason.

As illustrated in FIG. 5, the load drive circuit includes switching element Q1 including a MOSFET, first comparator CP1, second comparator CP2, and clamp circuit 14. First comparator CP1 compares first reference voltage V1 that is lower than the voltage of power supply E inputted to power supply terminal Vcc with output voltage Vout of output terminal OUT. When output voltage Vout is equal to or higher than first reference voltage V1, first comparator CP1 outputs an H level for detection of the load open state.

Second comparator CP2 compares second reference voltage V2 that is lower than the voltage of power supply E and higher than a clamp voltage Vclamp with output voltage Vout of output terminal OUT. When output voltage Vout is equal to or higher than second reference voltage V2, second comparator CP2 outputs an H level for detection of an output-to-supply short circuit state.

When switching element Q1 is off and load 20 is not connected to output terminal OUT, i.e., load 20 is in the load open state, clamp circuit 14 clamps the voltage of output terminal OUT to the clamp voltage Vclamp that is higher than first reference voltage V1 and lower than the voltage of power supply E.

With the above-described configuration, when the load is in the load open state and switching element Q1 is off, output voltage Vout is clamped to the clamp voltage by the clamp circuit.

In the above state, first comparator CP1 can detect the load open state since first reference voltage V1 of first comparator CP1 is set to GND<V1<Vclamp, whereas second comparator CP2 does not detect the output-to-supply short circuit since second reference voltage V2 of second comparator CP2 is set to Vclamp<V2<E.

Meanwhile, in the output-to-supply short circuit state, the voltage of output terminal OUT rises to the voltage of power supply E, even when switching element Q1 is off. In this state, first comparator CP1 detects the current state as the load open state since first reference voltage V1 of first comparator CP1 is set to GND<V1<Vclamp, whereas second comparator CP2 can detect the output-to-supply short circuit state since second reference voltage V2 is set to Vclamp<V2<E.

In addition, when an N-type MOSFET is used as a high-side transistor of switching element Q1 for output, bootstrap circuit BS is added as illustrated in FIG. 5.

DETAILED DESCRIPTION

Figure 5:
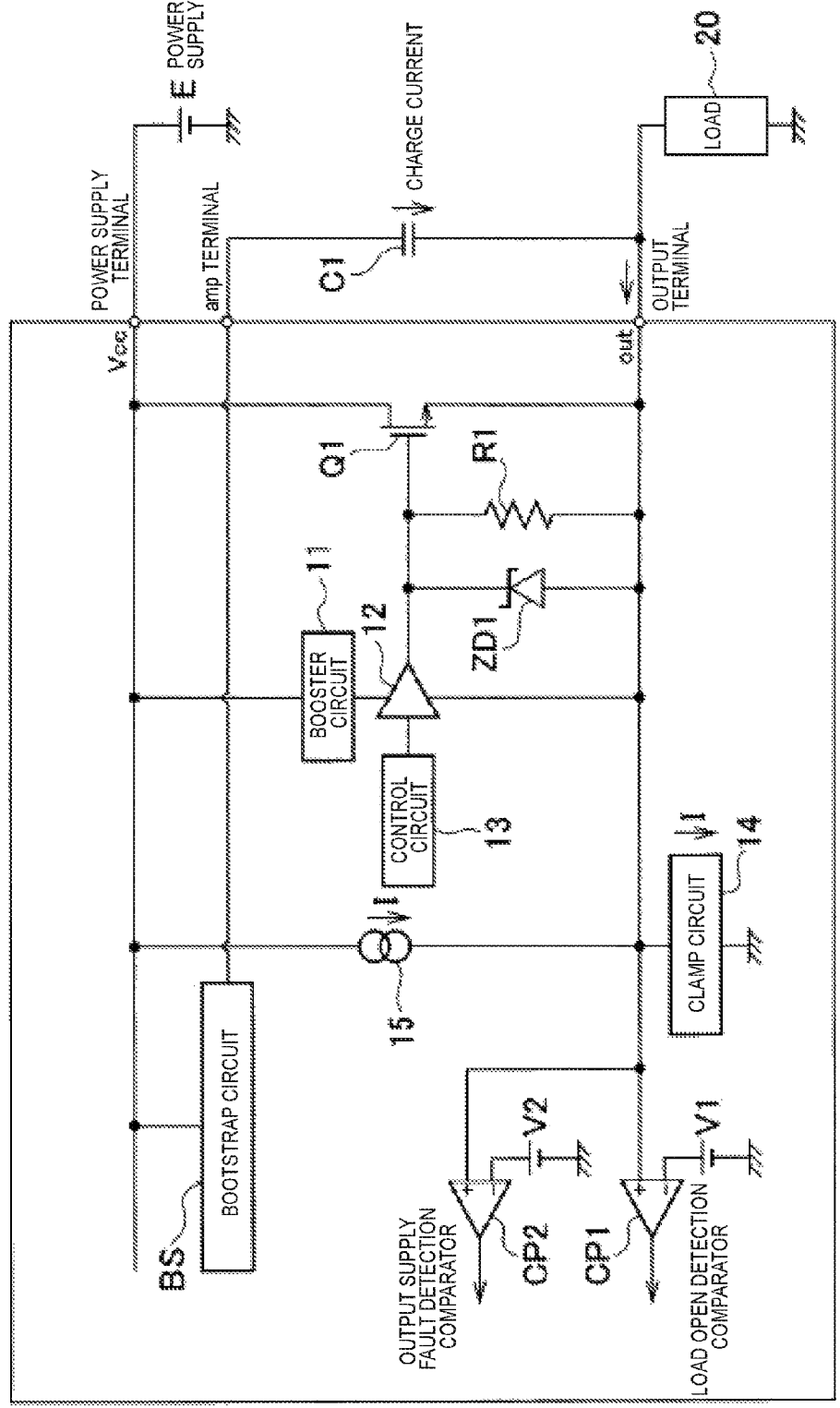
FIG. 5 is a diagram illustrating a conventional load drive circuit.

Hereinafter, load drive circuits according to embodiments are described in detail with reference to the drawings. Note that constituents that are the same as those in the conventional load drive circuit illustrated in FIG. 5 are denoted by the same reference signs as those used for the conventional technique.

First Embodiment

Figure 1:
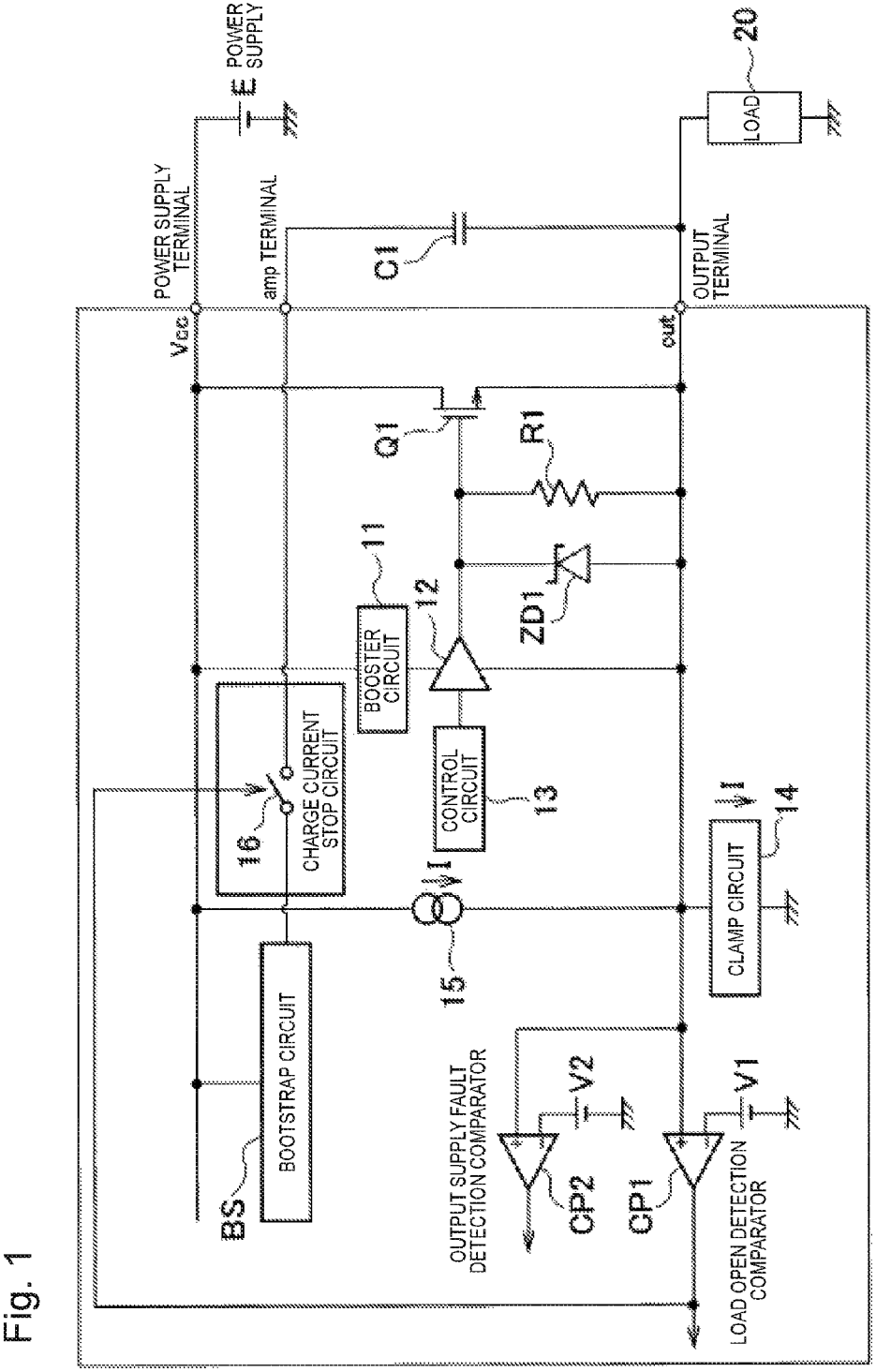
FIG. 1 is a diagram illustrating a load drive circuit according to a first embodiment.

FIG. 1 is a diagram illustrating a circuit configuration of a load drive circuit according to a first embodiment. The load drive circuit illustrated in FIG. 1 includes power supply terminal Vcc, switching element Q1, booster circuit 11, buffer circuit 12, control circuit 13, output terminal OUT, clamp circuit 14, constant-current circuit 15, first comparator CP1, second comparator CP2, bootstrap circuit BS, and charge current stop circuit 16, and is configured to drive load 20 connected to output terminal OUT by using power inputted from power supply E connected to power supply terminal Vcc.

Switching element Q1 switches a power supply path extending from power supply terminal Vcc to output terminal OUT between on and off, and controls a current flowing through load 20 by the switching between on and off. In switching element Q1, a MOSFET is used as a high-side switch. A drain of switching element Q1 is connected to power supply terminal Vcc, and a source of switching element Q1 is connected to output terminal OUT. Note that a bipolar transistor may be used as switching element Q1.

In addition, resistor R1 and gate protection constant-voltage diode ZD1 are connected in parallel between a gate and the source of switching element Q1. Switching element Q1, resistor R1, gate protection constant-voltage diode ZD1, buffer circuit 12, and clamp circuit 14 constitute a high-side drive circuit.

Control circuit 13 is connected to booster circuit 11 through buffer circuit 12, and outputs a control signal that controls the on/off operation of switching element Q1. Control circuit 13 causes booster circuit 11, which boosts voltage E, to boost the control signal to a voltage higher than voltage E, and applies the control signal to the gate of switching element Q1. In this manner, control circuit 13 controls the on/off operation of switching element Q1.

Constant-current circuit 15 is connected between power supply terminal Vcc and output terminal OUT in parallel with switching element Q1, and causes constant current I to flow in a range where load 20 is not driven by the current (for example, in a range from several tens of microamperes to one hundred microamperes).

Clamp circuit 14 has an impedance that is 10 or more times, and preferably 100 or more times the impedance of load 20, and is connected in parallel with load 20. When switching element Q1 is off, and the load is the open state, constant current I caused to flow by constant-current circuit 15 flows through only clamp circuit 14.

Accordingly, a clamp voltage is determined by the constant current I caused to flow by constant-current circuit 15 and the impedance of clamp circuit 14, and takes a value that is higher than a ground potential and lower than voltage E.

Note that, when the switching element Q1 is off and the load is not in the open state, almost all of constant current I caused to flow by constant-current circuit 15 flows through load 20, and voltage Vout of output terminal OUT is almost equal to the ground potential.

Functions of first comparator CP1 and second comparator CP2 are the same as those illustrated in FIG. 5, and descriptions thereof are omitted.

Capacitor C1 is a bootstrap capacitor with one terminal connected to output terminal OUT and another terminal connected to an amp terminal. Bootstrap circuit BS includes a constant voltage circuit that generates a constant voltage on the basis of voltage E of the power supply of power supply terminal Vcc. The bootstrap circuit BS supplies a charge current to the amp terminal at the constant voltage. Note that, in this embodiment, bootstrap circuit BS and capacitor C1 together may constitute the bootstrap circuit. The capacitor C1 may be outside of the load drive circuit, which may be implemented in a single chip such as an IC (Integrated Circuit).

In addition, charge current stop circuit 16 is provided between bootstrap circuit BS and the amp terminal. Charge current stop circuit 16 includes a switch, and constitutes a clamp voltage rise prevention circuit that prevents the clamp voltage of clamp circuit 14 from rising, when first comparator CP1 detects the load open state.

Next, operations of the thus configured load drive circuit of the first embodiment are described in detail with reference to FIG. 2.

First, in a normal state, i.e., in neither the load open state nor the output-to-supply short circuit state, a current flows through load 20, when switching element Q1 is on. Here, voltage Vout of output terminal OUT is equal to input voltage E. When switching element Q1 is off in the normal state, almost all of constant current I caused to flow by constant-current circuit 15 flows through load 20.

Accordingly, when the switching element Q1 is off, voltage Vout of output terminal OUT is almost equal to the ground potential, and is smaller than each of reference voltage V1 and reference voltage V2. For this reason, each of the outputs from first comparator CP1 and second comparator CP2 takes an L level, and neither the load open state nor the output-to-supply short circuit state is detected.

Also in the load open state, when switching element Q1 is on, voltage Vout of output terminal OUT is equal to voltage E.

Next, when switching element Q1 is off in the load open state, constant current I caused to flow by constant-current circuit 15 flows through clamp circuit 14, and voltage Vout of output terminal OUT is clamped to a clamp voltage by clamp circuit 14. Accordingly, when switching element Q1 is off, voltage Vout of output terminal OUT exceeds reference voltage V1. As a result, the output of first comparator CP1 takes an H level, and the load open state is detected.

When a load open state detection signal is outputted from first comparator CP1 to charge current stop circuit 16, the switch of charge current stop circuit 16 is turned off. Hence, the supply of the charge current from bootstrap circuit 10 to capacitor C1 is stopped. For this reason, the charge current from bootstrap circuit 10 does not raise clamp voltage Vclamp of clamp circuit 14.

Accordingly, clamp voltage Vclamp does not exceed second reference voltage V2, and second comparator CP2 outputs an L level. This makes it possible to prevent false detection of the output-to-supply short circuit state.

In addition, in the output-to-supply short circuit state, the clamp voltage is equal to voltage E. Hence, voltage E is inputted to a non-inverting terminal of second comparator CP2, and voltage Vclamp is inputted to an inverting terminal of comparator CP2. Accordingly, the second comparator CP2 outputs an H level. This enables the detection of the output-to-supply short circuit state.

Figure 2:
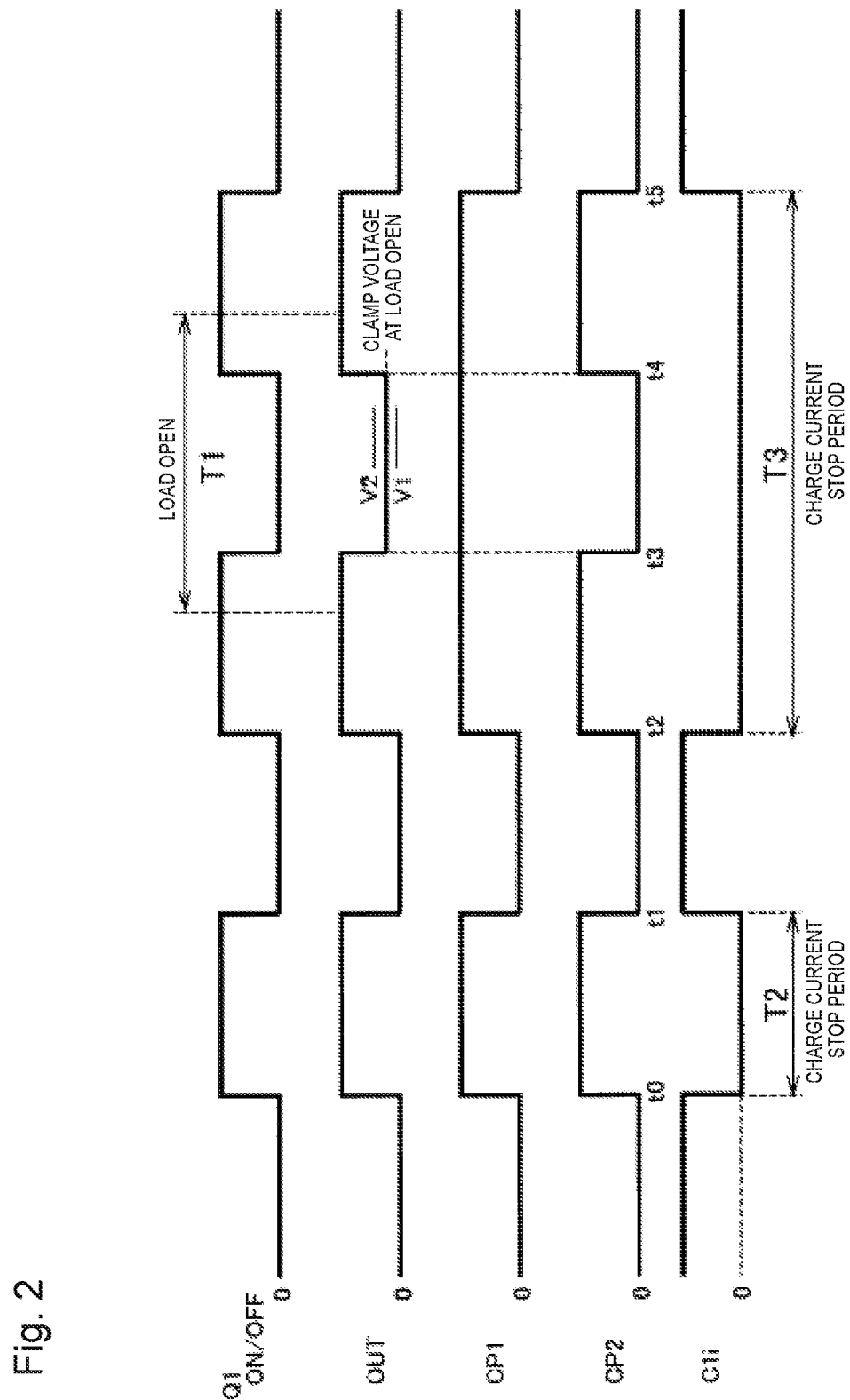
FIG. 2 is a diagram illustrating operation waveforms of components in the load drive circuit according to the first embodiment.

FIG. 2 is a diagram illustrating operation waveforms of components in the load drive circuit according to the first embodiment. In general, as illustrated in FIG. 2, the charge current to capacitor C1 is stopped from time t0 to time t1 (in charge current stop period T2), and the charge current is caused to flow through capacitor C1 from time t1 to time t2.

However, when the load is in the open state in period T1 including the period from time t3 to time t4 where the charge current should be caused to flow through capacitor C1, the switch of charge current stop circuit 16 is turned off in the period from time t3 to time t4 to stop the charge current from bootstrap circuit 10. It can be understood that this makes it possible to keep constant the voltage of output terminal OUT, i.e., the clamp voltage.

Second Embodiment

Figure 3:
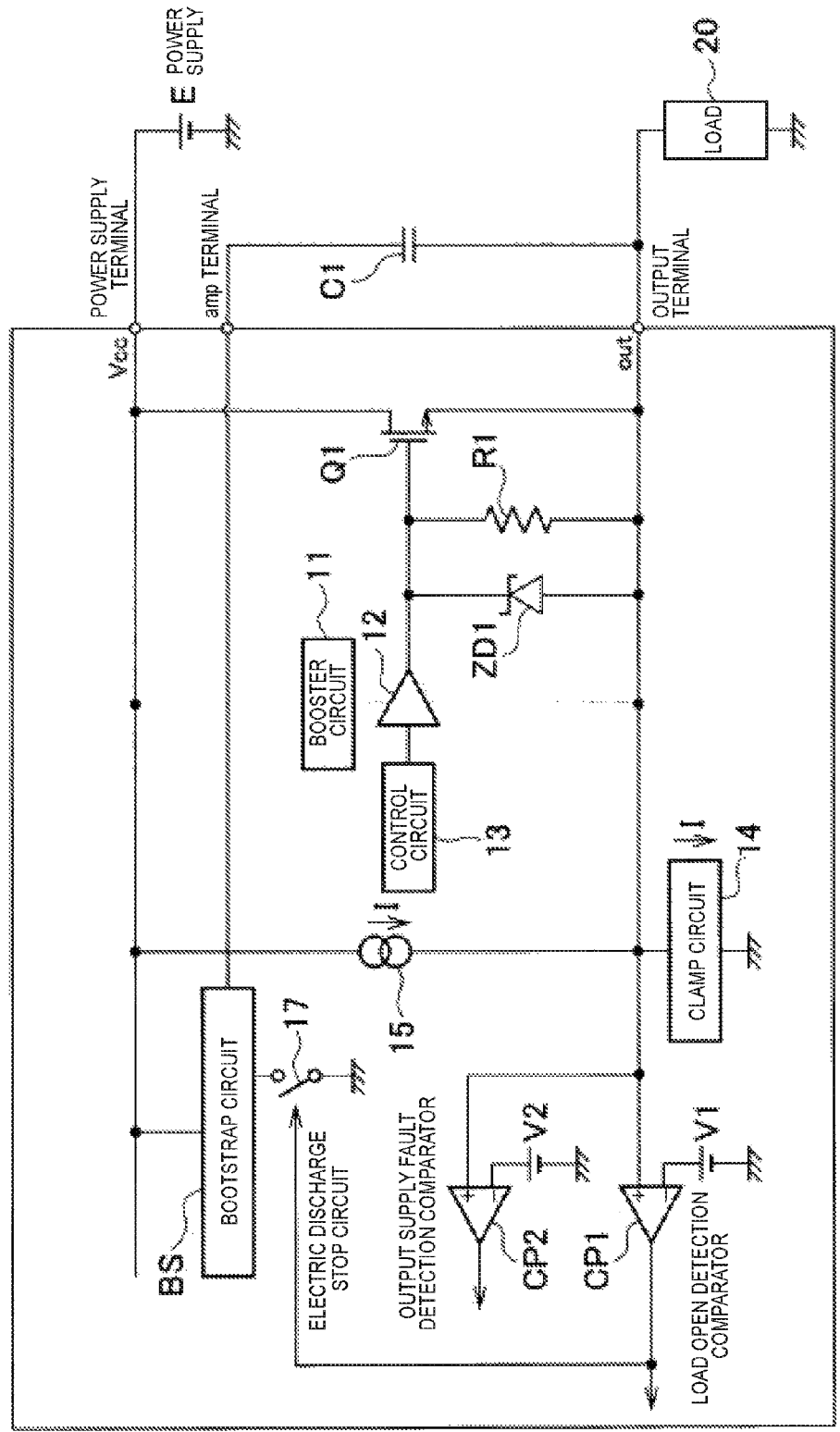
FIG. 3 is a diagram illustrating a load drive circuit according to a second embodiment.

FIG. 3 is a diagram illustrating a circuit configuration of a load drive circuit according to a second embodiment. The load drive circuit according to the second embodiment illustrated in FIG. 3 includes electric discharge stop circuit 17 instead of charge current stop circuit 16 in the load drive circuit according to the first embodiment illustrated in FIG. 1.

Note that the other constituents are the same as those of the load drive circuit of the first embodiment, and hence descriptions thereof are omitted.

Electric discharge stop circuit 17 includes a switch connected between bootstrap circuit BS and the ground, and is configured to turnoff the switch to stop the electric discharge by a current flowing from capacitor C1 through bootstrap circuit BS to the ground, when first comparator CP1 detects the load open state.

Operations of the thus configured load drive circuit of the second embodiment are described. The operation in the normal state and the operation in the load open state are the same as those of the load drive circuit of the first embodiment. Accordingly, an operation in a case where switching element Q1 is off and first comparator CP1 detects the load open state is described here.

First, the electric discharge from capacitor C1 to the ground is started, and the output from the amp terminal is lowered. Then, the constant voltage circuit of bootstrap circuit BS tries to cause a current to flow through the amp terminal to output the constant voltage.

When, however, a current flows through the amp terminal and through capacitor C1, the voltage of clamp circuit 14 rises. For this reason, the voltage of clamp circuit 14 becomes equal to or higher than first reference voltage V1, and first comparator CP1 outputs an H level to the switch of electric discharge stop circuit 17.

For this reason, the switch of electric discharge stop circuit 17 is turned off, and the electric discharge current is stopped from flowing from capacitor C1 through bootstrap circuit BS to the ground.

As a result, the voltage of clamp circuit 14 does not rise any more, and clamp voltage Vclamp does not exceeds second reference voltage V2. Hence, second comparator CP2 outputs an L level. This makes it possible to prevent false detection of the output-to-supply short circuit state.

In addition, the clamp voltage is equal to voltage E in the output-to-supply short circuit state. Hence, voltage E is inputted to the non-inverting terminal of second comparator CP2, and voltage Vclamp is inputted to the inverting terminal of comparator CP2. Hence, second comparator CP2 outputs an H level. This enables detection of the output-to-supply short circuit state.

Third Embodiment

Figure 4:
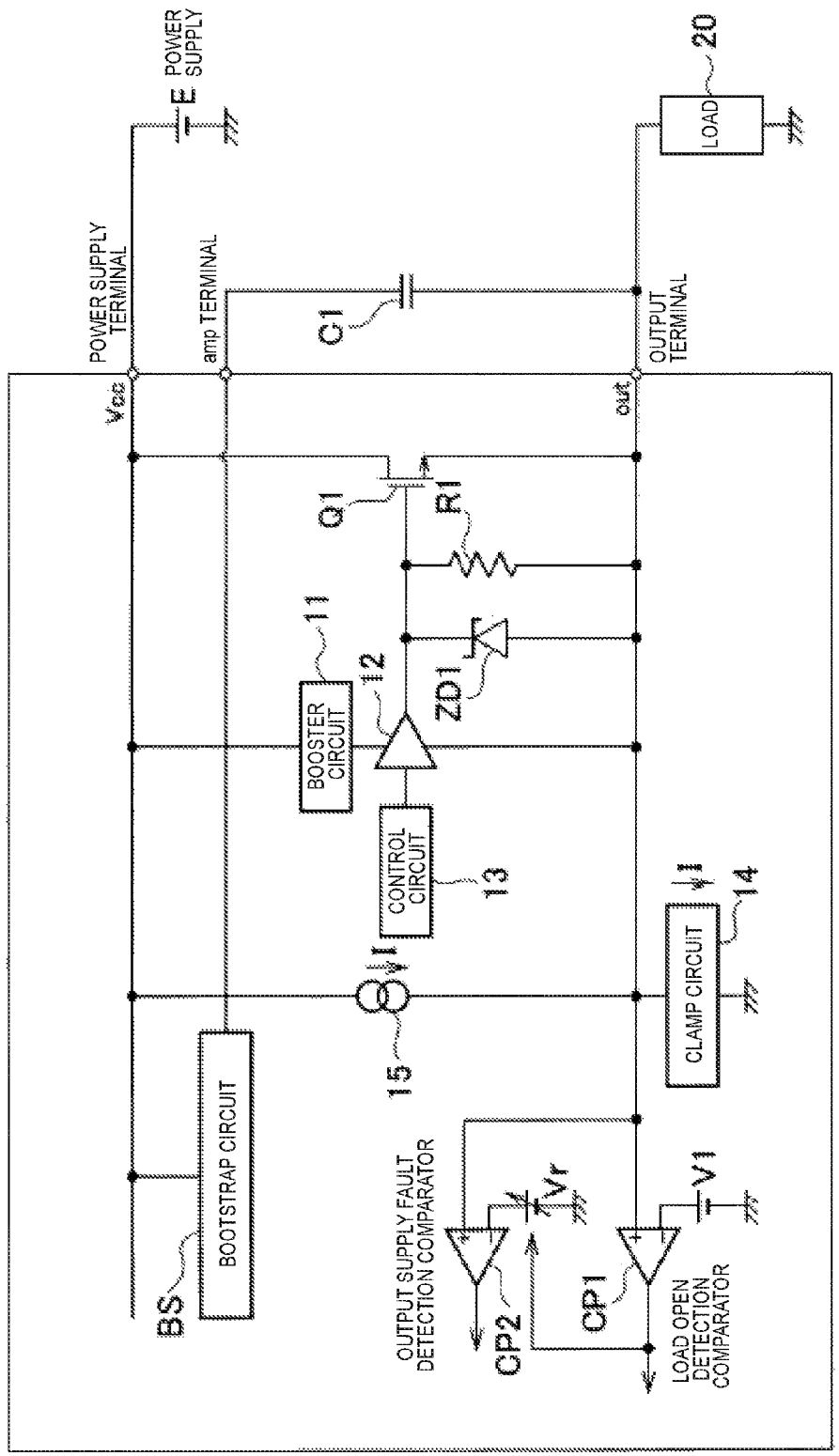
FIG. 4 is a diagram illustrating a load drive circuit according to a third embodiment.

FIG. 4 is a diagram illustrating a circuit configuration of a load drive circuit according to a third embodiment. In the load drive circuit according to the third embodiment, charge current stop circuit 16 of the load drive circuit according to the first embodiment illustrated in FIG. 1 is not provided. Instead, second comparator CP2 sets second reference voltage V2 to a voltage that is higher than a voltage to be generated by a current including a current flowing from bootstrap circuit BS through the amp terminal and capacitor C1 to clamp circuit 14 and that is lower than voltage E, when first comparator CP1 detects the load open state.

Note that the other constituents are the same as those of the load drive circuit of the first embodiment, and hence descriptions thereof are omitted.

Operations of the thus configured load drive circuit according to the third embodiment are described. The operation in the normal state and the operation in the load open state are the same as those of the load drive circuit of the first embodiment. Accordingly, an operation in a case where the switching element Q1 is off and first comparator CP1 detects the load open state is described here.

First, when first comparator CP1 detects the load open state, first comparator CP1 transmits a load open state detection signal to second reference voltage V2 of second comparator CP2. In response to the load open state detection signal, second reference voltage V2 is set to a voltage that is higher than voltage Vclamp2 generated by current I2 including current I1 flowing from bootstrap circuit BS through the amp terminal and capacitor C1 to clamp circuit 14 and that is lower than voltage E. Second reference voltage V2 is preferably set according to voltage E.

Here, current I2 is a total current of current I1 flowing from bootstrap circuit BS through the amp terminal and capacitor C1 to clamp circuit 14 and current I from constant-current circuit 15. Voltage Vclamp2 generated by current I2 is larger than voltage Vclamp generated by current I from constant-current circuit 15.

Second reference voltage V2 is a voltage that is higher than voltage Vclamp2 and lower than voltage E. Hence, clamp voltage Vclamp2 does not exceeds second reference voltage V2, when the circuit is not in the output-to-supply short circuit state. Accordingly, second comparator CP2 outputs an L level. This makes it possible to prevent false detection of the output-to-supply short circuit state.

In addition, in the output-to-supply short circuit state, the clamp voltage is equal to voltage E. Hence, voltage E is inputted to the non-inverting terminal of second comparator CP2, and a voltage that is higher than voltage Vclamp2 and lower than voltage E is inputted to the inverting terminal of comparator CP2. Accordingly, second comparator CP2 outputs an H level. This enables detection of the output-to-supply short circuit state.

Figure 6:
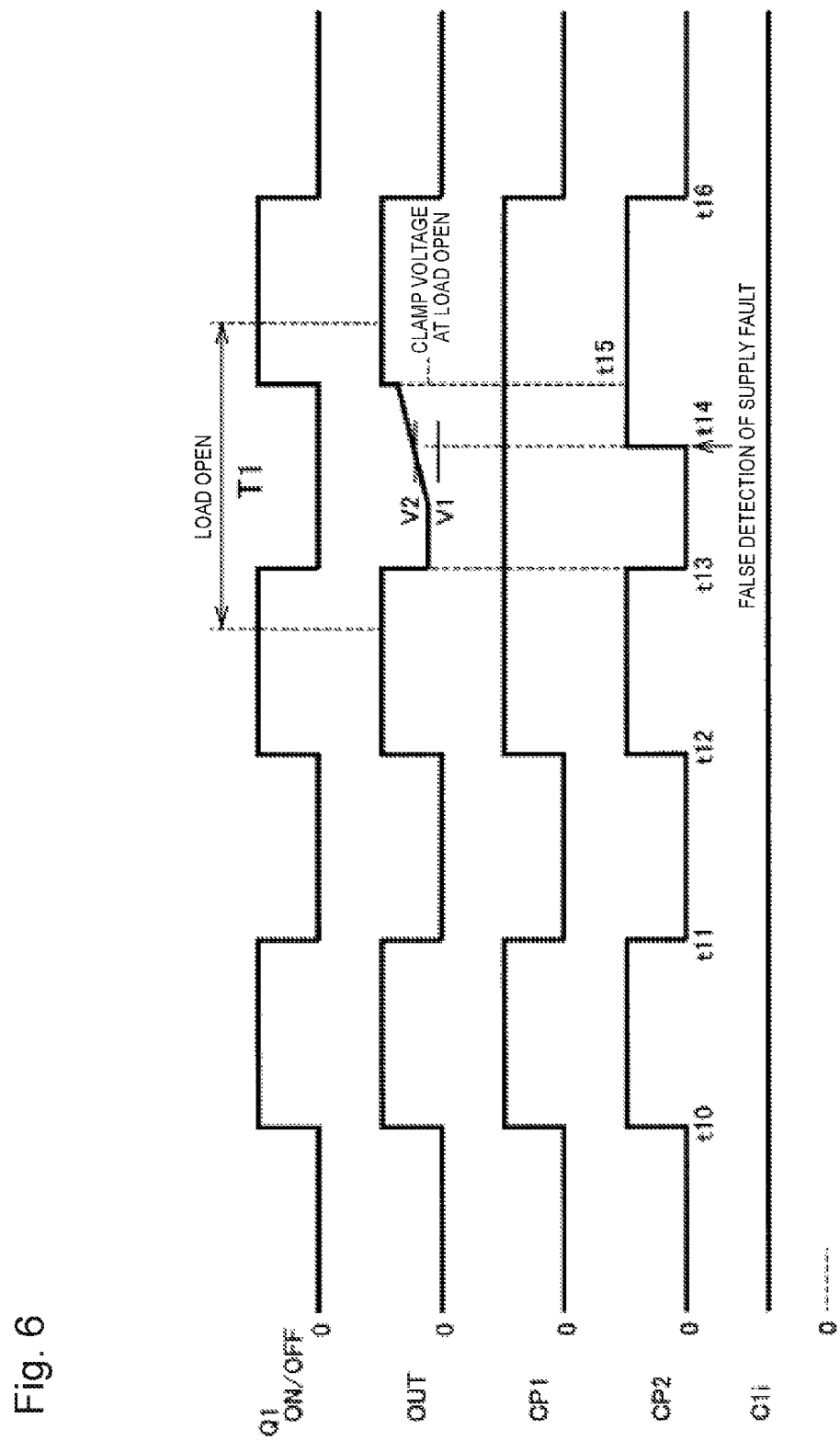
FIG. 6 is a diagram illustrating operation waveforms of components in the conventional load drive circuit.

A problem occurring when the load is in the load open state in the technique described in Patent Document 1, in which bootstrap circuit BS is added, is described with reference to FIG. 6. In FIG. 6, Q1 ON/OFF represents an on/off signal of switching element Q1, OUT represents an output voltage, CP1 represents an output of first comparator CP1, CP2 represents an output of second comparator CP2, and C1i represents a charge current flowing through capacitor C1.

When the load is in the load open state in period T1, a current flows from bootstrap circuit BS through capacitor C1 to a resistor in clamp circuit 14. For this reason, the voltage greatly drops because of the resistor in clamp circuit 14, and clamp voltage Vclamp, i.e., output voltage OUT rises. At time t14, output voltage OUT equals to second reference voltage V2. Accordingly, second comparator CP2 outputs an H level. In other words, false detection of the output-to-supply short circuit state occurs, although the circuit is not in the output-to-supply short circuit state, actually.

In this embodiment, when the first comparator detects the load open state, the clamp voltage rise prevention circuit prevents the clamp voltage of the clamp circuit from rising. In addition, when the first comparator detects the load open state, the second reference voltage is set to a voltage that is higher than the voltage to be generated by the current including the current flowing from the bootstrap circuit through the third terminal and the capacitor to the clamp circuit and that is lower than the input voltage. Accordingly, the above-described embodiment makes it possible to prevent the false detection of the output-to-supply short circuit state, when a bootstrap circuit is connected.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A load drive circuit comprising:
   a switch electrically connected between a first terminal electrically connected to a power supply and a second terminal electrically connected to a load;
   a first comparator that compares a first reference voltage lower than an input voltage inputted to the first terminal with a voltage of the second terminal, and detects, based on the comparison, a load open state where the switch is off and the load is not electrically connected to the second terminal;
   a clamp circuit that clamps the voltage of the second terminal to a clamp voltage higher than the first reference voltage and lower than the input voltage, when the first comparator detects the load open state;
   a second comparator that compares a second reference voltage lower than the input voltage and higher than the clamp voltage with the voltage of the second terminal, and detects, based on the comparison, an output-to-supply short circuit state where the switch is off and the second terminal is electrically connected to the power supply;
   a bootstrap circuit that generates a constant voltage based on the input voltage of the first terminal, and supplies a charge current to a capacitor connectable to the load device through the third terminal at the constant voltage; and a clamp voltage rise prevention circuit that prevents the clamp voltage of the clamp circuit from rising, when the first comparator detects the load open state.

2. The load drive circuit of claim 1, wherein
the clamp voltage rise prevention circuit includes a charge current stop circuit that stops a current from flowing from the bootstrap circuit through the third terminal and the capacitor to the clamp circuit, when the first comparator detects the load open state.

3. The load drive circuit of claim 2, wherein
the charge current stop circuit includes a switch electrically connected between the bootstrap circuit and the third terminal, and turns off the switch, when the first comparator detects the load open state.

4. The load drive circuit of claim 1, wherein
the clamp voltage rise prevention circuit includes an electric discharge stop circuit that stops electric discharge of the capacitor, when the first comparator detects the load open state.

5. The load drive circuit of claim 4, wherein
the electric discharge stop circuit includes a switch electrically connected between the bootstrap circuit and a ground, and turns off the switch, when the first comparator detects the load open state.

* * * * *